(12) United States Patent
Ma et al.

(10) Patent No.: US 6,799,978 B2
(45) Date of Patent: Oct. 5, 2004

(54) ELECTRICAL CONNECTOR WITH METAL STIFFENERS

(75) Inventors: Hao-Yun Ma, Tu-chen (TW); Ming-Lun Szu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/453,224

(22) Filed: Jun. 2, 2003

(65) Prior Publication Data

US 2004/0121630 A1 Jun. 24, 2004

(30) Foreign Application Priority Data

Dec. 20, 2002 (TW) ...................................... 91220808 U

(51) Int. Cl.[7] .............................................. H01R 13/62
(52) U.S. Cl. ........................................ 439/73; 439/331
(58) Field of Search .................................. 439/73, 331

(56) References Cited

U.S. PATENT DOCUMENTS

| | | | | |
|---|---|---|---|---|
| 4,555,157 A | * | 11/1985 | Johnson et al. | ............. 436/325 |
| 5,226,826 A | * | 7/1993 | Nillson et al. | ................. 439/72 |
| 5,344,334 A | * | 9/1994 | Laub et al. | ................. 439/331 |
| 6,042,412 A | * | 3/2000 | Murr | ........................... 439/331 |
| 6,244,875 B1 | * | 6/2001 | McHugh et al. | ............. 439/73 |
| 6,390,832 B1 | * | 5/2002 | Kuo | .......................... 439/101 |
| 6,464,525 B2 | * | 10/2002 | Mizumura | ................... 439/342 |
| 6,585,535 B2 | * | 7/2003 | Murr et al. | ................. 439/331 |

* cited by examiner

*Primary Examiner*—Gary Paumen
(74) *Attorney, Agent, or Firm*—Wei Te Chung

(57) ABSTRACT

An LGA connector (1) includes a housing (11), a pair of stiffeners (10), a clip (12), and a lever (13). The housing includes a pair of side portions (116). Each side portion defines a retaining space (118) with an elongated protrusion (1182), two channels (1180, 1181), and an end portion (1184). Each stiffener is positioned in a corresponding retaining space of the housing and includes opposite first and second portions (102, 103), and a third portion (101). The first portion defines a plurality of mounting holes (106). An outer face of each side portion defines a plurality of thread holes (119) corresponding to the mounting holes of the stiffener. A plurality of screws (14) mechanically connects the stiffeners with the housing through the thread holes of the housing and the mounting holes of the stiffeners. As a result, a structure of the housing is reinforced.

2 Claims, 6 Drawing Sheets

ELECTRICAL CONNECTOR WITH METAL STIFFENERS

BACKGROUND OF THE INVENTION

1. Field of the Invention

The present invention relates to an electrical connector for electrically connecting an electronic package such as a land grid array (LGA) chip with a circuit board such as a printed circuit board (PCB), and particularly to an LGA electrical connector with a housing and a pair of metal stiffeners.

2. Description of Prior Art

Connectors for removably mounting an LGA chip on a PCB are known as LGA connectors. A typical LGA electrical connector comprises an insulative housing, a multiplicity of terminals received in the housing in a rectangular array, a metal clip attached to the fastening frame, and an operational lever.

FIG. 6 shows a conventional LGA electrical connector 6. The LGA connector 6 comprises an insulative housing 63, a multiplicity of terminals 64 received in the housing 63, an operational lever 62 engaged with the housing 63, and a metal clip 65 mounted to the housing 63. The housing comprises a first end portion 630, and a second end portion 632 opposite to the first end portion 630. In assembly of the LGA connector 6, the lever 62 is engaged with the first end portion 630 of the housing 63. The clip 65 is pivotally mounted to the second end portion 632 of the housing 63. In use, the clip 65 is firstly oriented perpendicular to the housing 63. An LGA chip (not shown) is put into the housing 63. Then, the clip 65 is rotated down to abut the LGA chip, and the lever 62 is rotated so that it presses on the clip 65. Thus, the LGA chip is stably received in the LGA connector 6.

However, in this position, the clip 65 exerts great force on the second end portion 632 of the housing 63. Simultaneously, the lever 62 applies great force on the first end portion 630 of the housing 63. However, the clip 65 exerts either no force or only slight force on other portions of the housing 63. Accordingly, the housing 63 is prone to deform or warp upwardly at the first and second end portions 630, 632, due to the uneven application of external force. When this happens, the LGA chip cannot reliably contact the terminals 64 of the housing 63. This results in interruption or failure of electrical connection between the LGA chip and a PCB (not shown) on which the LGA connector 6 is mounted.

A new electrical connector that overcomes the above-mentioned problems is desired.

SUMMARY OF THE INVENTION

An object of the present invention is to provide an LGA electrical connector having a pair of stiffeners that reinforces a structure of a housing of the connector.

In order to achieve the above object, an LGA connector in accordance with a preferred embodiment of the present invention comprises an insulative housing, a multiplicity of terminals received in the housing, a pair of metal stiffeners engaged with the housing, a metal clip pivotally mounted to the housing, and a lever engaged with the housing. The housing comprises a first end portion, a second end portion and a pair of side portions. Each side portion of the housing defines a retaining space with two channels, and an elongated protrusion separating the two channels. One of the channels defines an end portion located in a junction of the side portion and the second end portion of the housing. Each stiffener is received in a corresponding retaining space of the housing and comprises a first portion, a second portion opposite to the first portion, and a third portion interconnecting the first and second portions, the first portion defining a plurality of mounting holes. An outer face of each side portion of the housing defines a plurality of thread holes corresponding to the mounting holes of the stiffener, a plurality of screws mechanically connects the stiffener with the housing through the thread holes of the housing and the mounting holes of the stiffeners. As a result, a structure of the housing is reinforced.

Other objects, advantages and novel features of the present invention will become more apparent from the following detailed description when taken in conjunction with the accompanying drawings, in which:

DESCRIPTION OF THE PREFERRED EMBODIMENT

Reference will now be made to the drawings to describe the present invention in detail.

Figure 1:
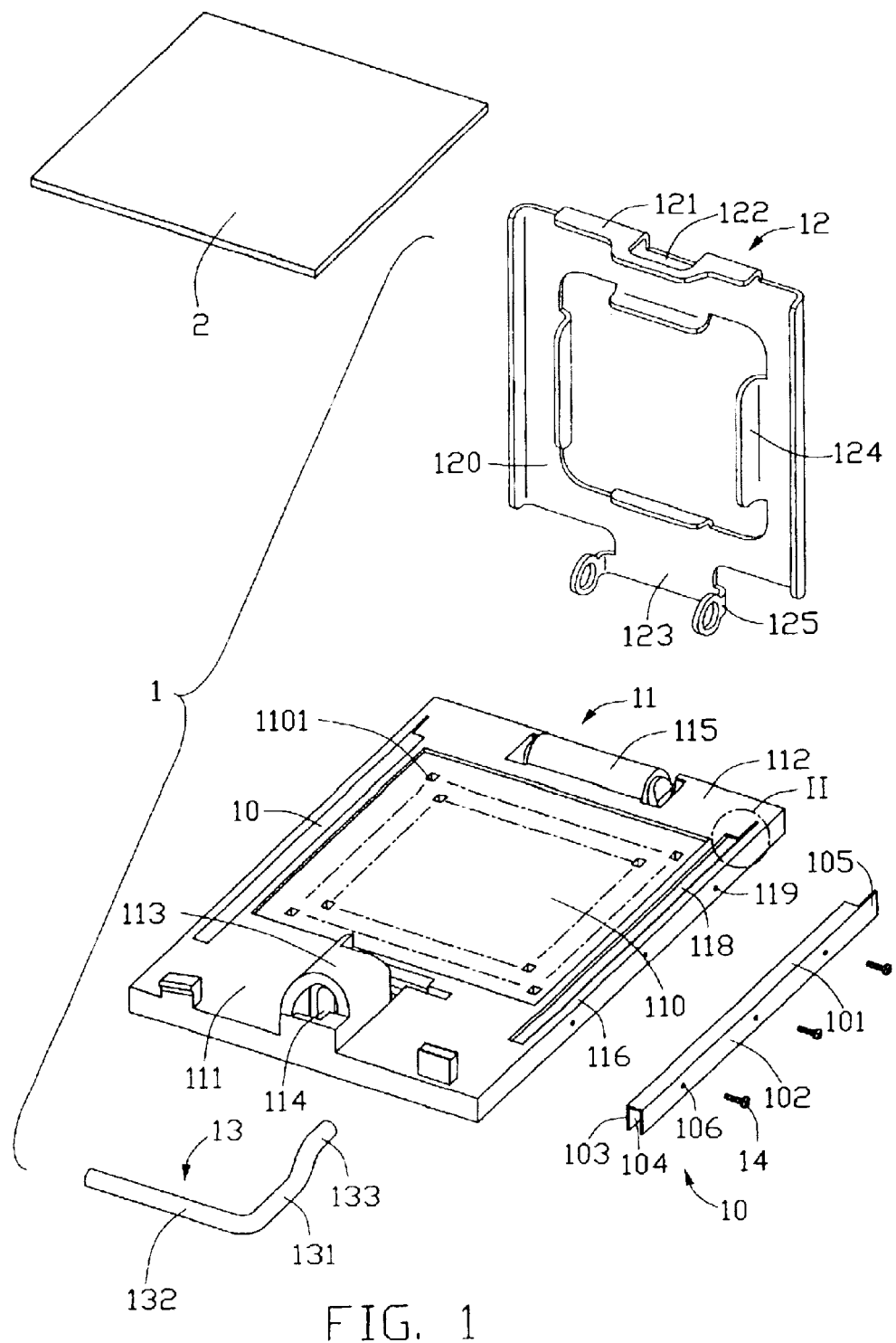
FIG. 1 is a simplified, exploded, isometric view of an LGA connector in accordance with the preferred embodiment of the present invention, together with an LGA chip.
Figure 2:
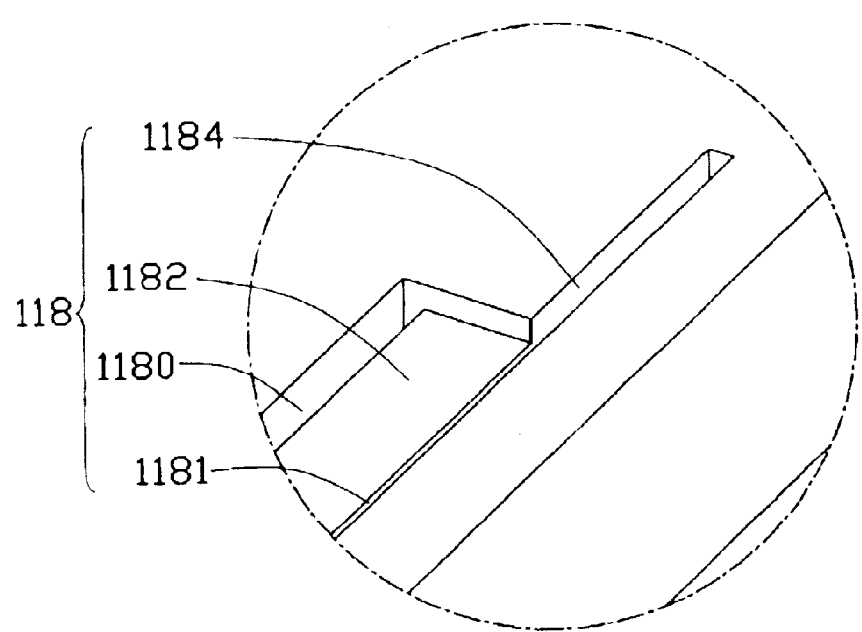
FIG. 2 is an enlarged view of a circle portion II of FIG. 1.
Figure 3:
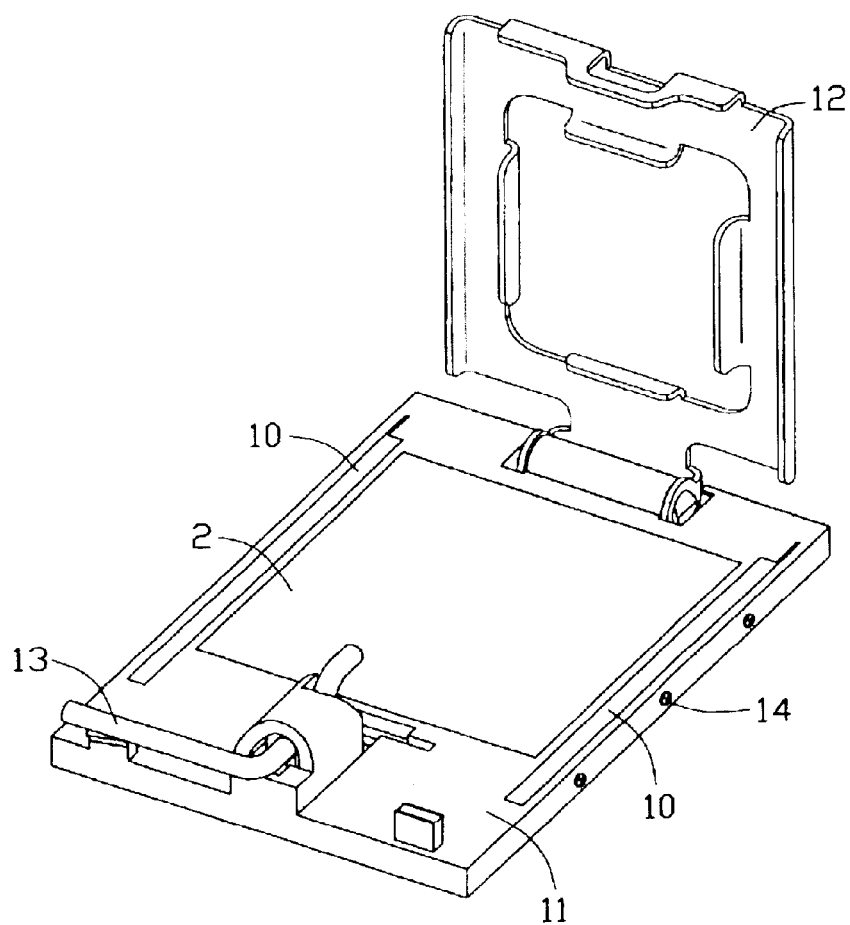
FIG. 3 is an assembled view of FIG. 1, showing a clip and a lever of the LGA connector in respective first positions.

Referring to FIGS. 1, 2 and 3, an LGA electrical connector 1 in accordance with the preferred embodiment of the present invention is adapted for electrically connecting an electronic package such as a land grid array (LGA) chip 2 with a circuit substrate such as a printed circuit board (PCB) (not shown). The LGA connector 1 comprises an insulative housing 11 soldered to the PCB, a pair of metal stiffeners 10 engaged with the housing 11, a metal clip 12 pivotally attached to the housing 11, and an operational lever 13 mounted to the housing 11.

The lever 13 comprises an operational arm 132, a middle portion 131 extending perpendicularly from one end of the operational arm 132, and a generally L-shaped pressing portion 133 extending from a distal end of the middle portion 131.

The clip 12 comprises a rectangular main body 120 with an opening (not labeled) defined in a middle thereof, a first end plate 121 depending from one end of the main body 120, and a second end plate 123 extending from an opposite end of the main body 120. An aperture 122 is defined in the first end plate 121, for receiving the pressing portion 133 of the lever 13 in use of the LGA connector 1. A pair of pivot portions 125 depends from opposite sides of the second end plate 123, respectively. Four side plates 124 depend from four inner sides of the main body 120 at the opening, respectively.

The housing 11 comprises a rectangular main body 110 receiving the LGA chip 2, a first end portion 111, a second end portion 112 opposite to the first end portion 111, and a pair of side portions 116 interconnecting the first and second end portions 111, 112. The main body 110 defines a multiplicity of passageways 1101 arranged in a rectangular array, the passageways 1101 receiving a multiplicity of terminals (not shown). A cam projection 113 protrudes from a middle of the first end portion 111. A curved receiving groove 114 is defined in a center of the cam projection 113, the receiving groove 114 movably receiving the middle portion 131 of the lever 13. An arched pivot protrusion 115 protrudes from a middle of the second portion 112. When the clip 12 is attached to the housing 11, the pivot portions 125 of the clip 12 are pivotally mounted to the pivot protrusion 115 of the housing 11. Each side portion 116 defines a retaining space 118 spanning along a longitudinal direction thereof, the retaining space 118 receiving a corresponding stiffener 10. The retaining space 118 comprises a shorter inner first channel 1180, and a parallel longer outer second channel 1181, with an elongated protruding portion 1182 separating the first and second channels 1180, 1181. A top surface of the protruding portion 1182 is lower than a top surface of the side portion 116. The second channel 1181 includes an end portion 1184 located in a junction of the side portion 116 and the second end portion 111. Three spaced thread holes 119 are defined in an outer face of each side portion 116, in communication with the second channel 1181 of the retaining space 118.

A cross-section of each stiffener 10 is substantially U-shaped. The stiffener 10 comprises an outer first sidewall 102, an inner second sidewall 103 parallel and opposite to the first sidewall 102, and a top wall 101 perpendicular to and interconnecting the first and second sidewalls 102, 103. The first and second sidewalls 102, 103 and top wall 101 cooperatively define a trench 104 therebetween. The first sidewall 102 comprises an extending portion 105, corresponding to the end portion 1184 of a respective retaining space 118 of the housing 11. The extending portion 105 prevents the stiffener 10 from being incorrectly received in the retaining space 118 in a reversed orientation. Three spaced mounting holes 106 are defined in the first sidewall 102, corresponding to the mounting holes 119 of a respective side portion 116 of the housing 11. In assembly of the stiffener 10, the first and second sidewalls 102, 103 of the stiffener 10 are received in the second and first channels 1181, 1180 of the corresponding retaining space 118, respectively. The protruding portion 1182 of the retaining space 118 is retained in the trench 104 of the stiffener 10. The extending portion 105 of the stiffener 10 is fastened in the end portion 1184 of the second channel 1181. Three fasteners such as screws 14 are extended through the thread holes 119 and the mounting holes 106 to mechanically connect the stiffener 10 with the housing 11. Thus, both stiffeners 10 are securely engaged with the housing 11, and structures of the side portions 116 of the housing 11 are reinforced.

Referring particularly to FIG. 3, to attach the LGA chip 2 in the LGA connector 1, the clip 12 is oriented perpendicular to the housing 11 in a first position. The lever 13 is oriented in a first position, with the pressing portion 133 thereof at a highest location. The LGA chip 2 is then put into the housing 11 so that it rests on the terminals of the housing 11.

Figure 4:
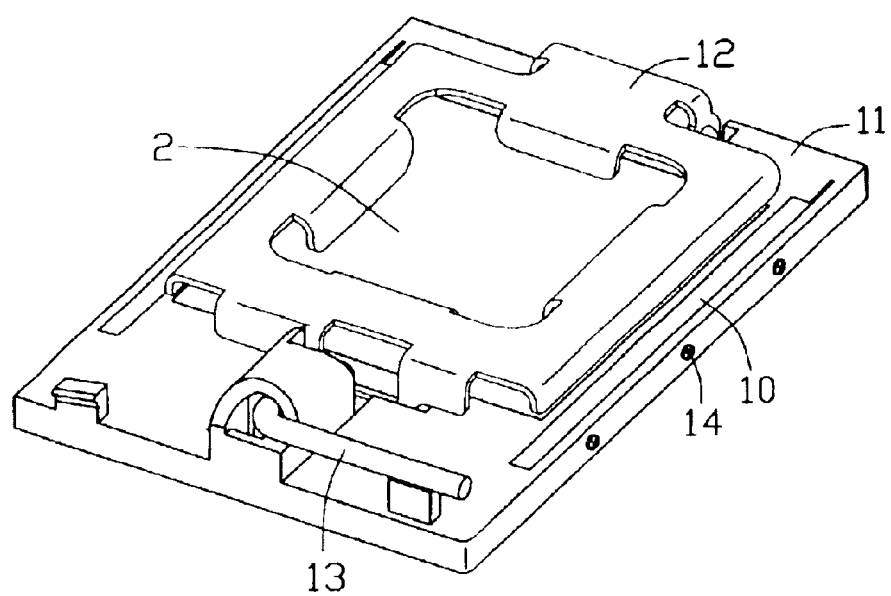
FIG. 4 is similar to FIG. 3, but showing the clip and the lever in respective second positions.

Referring to FIG. 4, the clip 12 is rotated down to a horizontal second position, with the side plates 124 abutting against the LGA chip 2. The operational arm 132 of the lever 13 is rotated to a second position, with the pressing portion 133 of the lever 13 being engagingly retained in the aperture 122 of the clip 12. Thus, the LGA chip 2 is stably and securely fastened in the electrical connector 1. The LGA chip 2 is electrically connected with the terminals of the housing 11, and is accordingly electrically connected with the PCB.

In the second position, the clip 12 exerts great force on the second end portion 112 of the housing 11. The lever 13 applies great force on the first end portion 111 of the housing 11. Nevertheless, due to the reinforced structures of the side portions 116 of the housing 11, the housing 11 resists deformation or warpage. Thus, the electrical connection between the LGA chip 2 and the PCB is stable and reliable.

Figure 5:
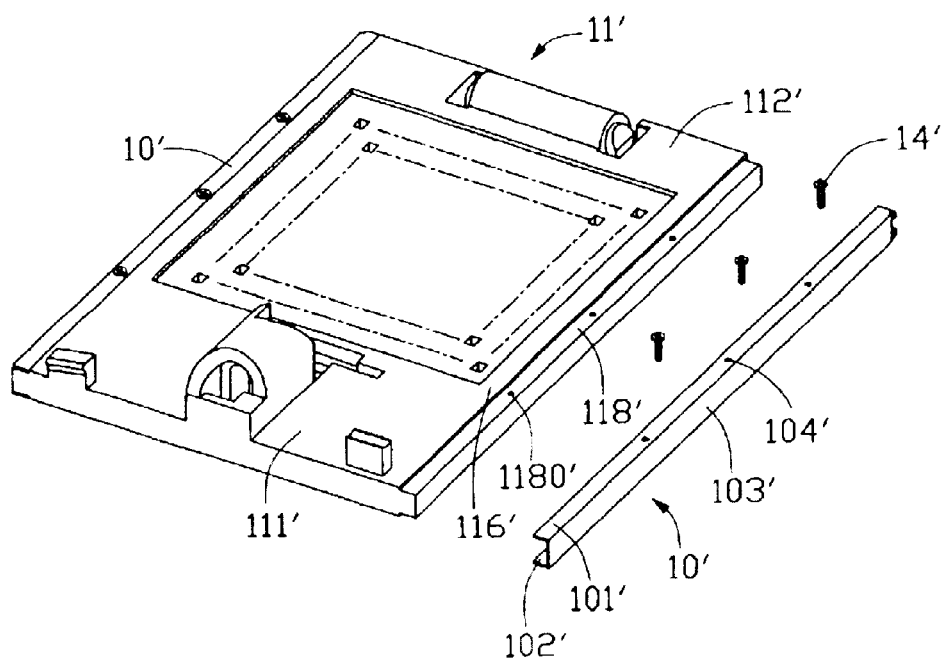
FIG. 5 is an exploded, isometric view of a housing and a pair of stiffeners of an LGA connector in accordance with an alternative embodiment of the present invention.
Figure 6:
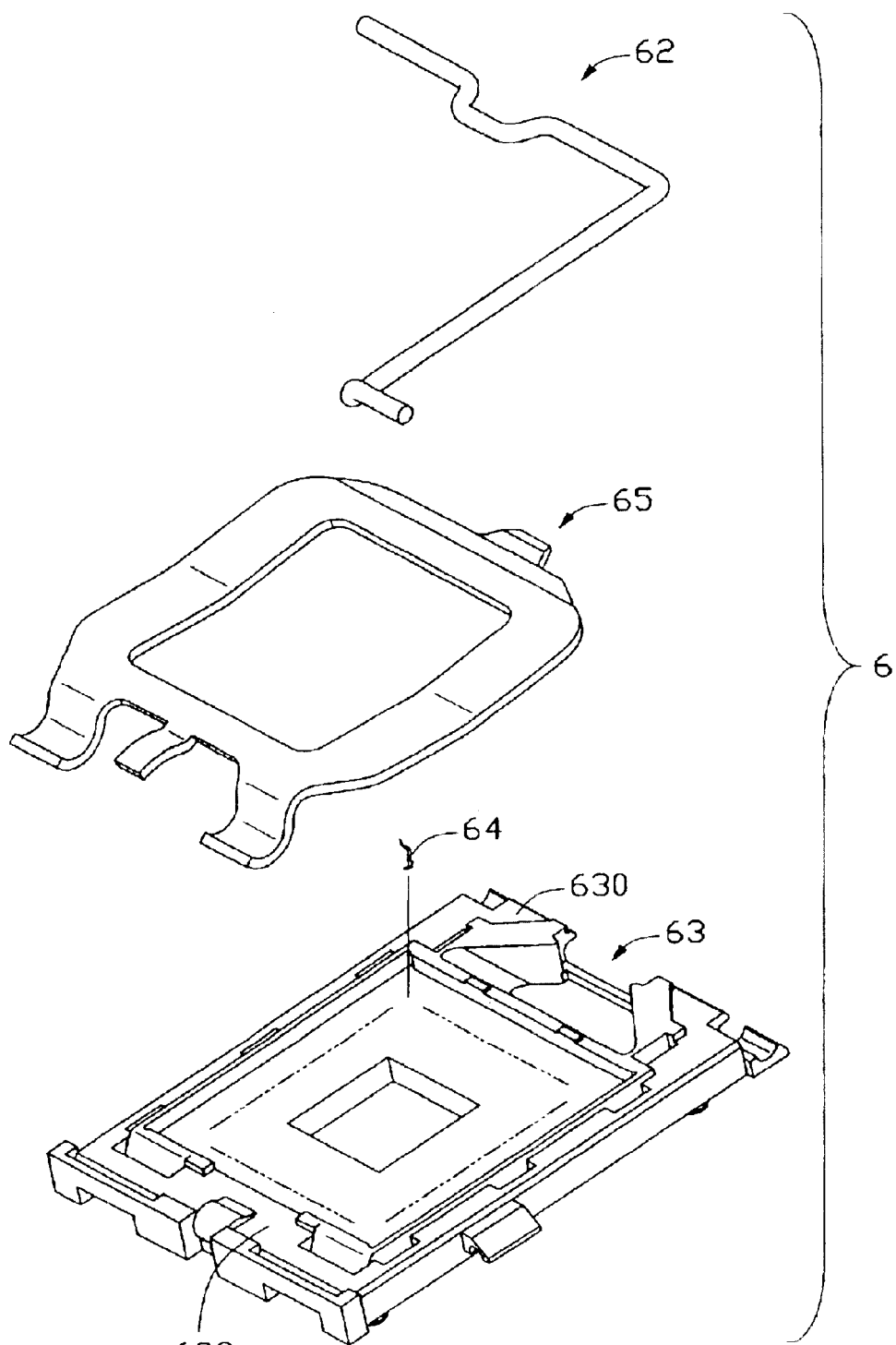
FIG. 6 is a simplified, exploded isometric view of a conventional LGA connector.

Referring to FIG. 5, a housing 11' and a pair of stiffeners 10' in accordance with an alternative embodiment of the present invention have structures similar to those of the housing 11 and the pair of stiffeners 10 of the preferred embodiment, respectively. The housing 11' comprises a first end portion 111', a second end portion 112', and a pair of side portions 116'. Each side portion 116' forms an elongate, narrowed protrusion 118'. The protrusion 118' has top and bottom surfaces respectively offset from top and bottom surfaces of its side portion 116', thereby forming a stepped configuration. Three spaced thread holes 1180' are defined in the top surface of the protrusion 118'. Each stiffener 10' comprises a top wall 101', a bottom wall 102' opposite to the top wall 101', and a sidewall 103' perpendicular to and interconnecting the top and bottom walls 101', 102'. Three mounting holes 104' are defined in the top wall 101', corresponding to the thread holes 1180' of a respective protrusion 118'. Three fasteners such as screws 14' are extended through the mounting holes 104' and into the thread holes 1180' to connect the stiffener 10' with the housing 11'. The housing 11' and the stiffeners 10' can perform substantially the same functions as described above in relative to the housing 11 and the stiffeners 10 of the preferred embodiment.

While preferred embodiments in accordance with the present invention have been shown and described, equivalent modifications and changes known to persons skilled in the art according to the spirit of the present invention are considered within the scope of the present invention as defined in the appended claims.

What is claimed is:

1. An electrical connector for electrically connecting an electronic package with a circuit substrate, the electrical connector comprising:

a housing defining a plurality of passageways therein and comprising a first end portion, a second end portion and a pair of side portions;

a plurality of terminals received in the passageways of the housing;

a lever attached to the first end portion of the housing;

a clip mounted to the second end portion of the housing; and a pair of stiffeners removably attached to the housing;

wherein each of the stiffeners is positioned in a corresponding side portion of the housing for reinforcing a structure of the housing;

wherein each side portion of the housing defines a retaining space with two channels, and an elongated protrusion separating the two channels, one of the channels including an end portion located in a junction of the side portion and the second end portion of the housing;

wherein each side portion of the housing comprises a protruding portion with two opposite surfaces being offset from two opposite surfaces of the side portion of the housing;

wherein a cross-section of each of the stiffeners is substantially U-shaped;

wherein each of the stiffeners comprises a first portion, a second portion opposite to the first portion, and a third portion interconnecting the first and second portions, one of the portions defining a plurality of mounting holes;

wherein an outer face of each side portion of the housing defines a plurality of thread holes corresponding to the mounting holes of the stiffener, a plurality of fasteners mechanically connecting the stiffener with the housing through the thread holes of the housing and the mounting holes of the stiffener;

wherein the first portion and second portion of the stiffener surround the two opposite surfaces of the protruding portion of the housing respectively, and the third portion abuts against an outer side face of the protruding portion of the housing;

wherein an extending portion of the stiffener extends from one end of the first portion for preventing the stiffener from being received in the housing in a reversed orientation;

wherein the protrusion of the retaining space abuts against a bottom face of the third portion of the stiffener, and two channels of the retaining space receive the first portion and second portion of the stiffener, with the end portion retaining the extending portion of the stiffener.

2. An electrical connector comprising:

an insulative housing defining opposite first and second ends along a lengthwise direction;

a plurality of terminals located in the housing between said first and second ends and in a matrix manner;

a clip pivotally mounted to a first end of the housing and dimensioned essentially at least equal to a terminal region defined by said matrix type terminals; and two pieces spaced and discrete slender metal stiffeners each self-formed by respective one piece, respectively attached to the housing and extending uninterruptedly along said lengthwise direction and located laterally by two sides of said terminal region;

wherein each of said stiffeners extends along with most portions of a full dimension of said housing in said lengthwise direction;

wherein a pivotal axis of said clip is perpendicular to said lengthwise direction;

wherein said metal stiffener is located about a lengthwise side edge of said housing;

wherein a lever is pivotally mounted to the second end of the housing;

wherein there are no other discrete means extending laterally for connecting said two stiffeners.

* * * * *